US006980917B2

(12) United States Patent
Ward et al.

(10) Patent No.: US 6,980,917 B2
(45) Date of Patent: Dec. 27, 2005

(54) OPTIMIZATION OF DIE YIELD IN A SILICON WAFER "SWEET SPOT"

(75) Inventors: Mark Ward, West Linn, OR (US); David Abercrombie, Gresham, OR (US); Larry Kelley, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 414 days.

(21) Appl. No.: 10/334,430

(22) Filed: Dec. 30, 2002

(65) Prior Publication Data

US 2004/0128630 A1    Jul. 1, 2004

(51) Int. Cl.[7] .............................................. G01R 31/14
(52) U.S. Cl. ...................................... 702/120; 716/19
(58) Field of Search .............................. 702/16, 34, 81, 702/84, 118–120, 128, 150, 155, 157, 168, 702/182–184; 716/2, 19, 21; 700/121

(56) References Cited

U.S. PATENT DOCUMENTS 5,305,222 A * 4/1994 Nakamura .................. 700/121
6,016,391 A * 1/2000 Facchini et al. ............... 716/21
6,604,233 B1 * 8/2003 Vickery et al. ................ 716/19

* cited by examiner

Primary Examiner—Marc S. Hoff
Assistant Examiner—Mohamed Charioui
(74) Attorney, Agent, or Firm—Fitch, Even, Tabin & Flannery (57) ABSTRACT

A method of increasing the wafer yield for an integrated circuit includes the steps of receiving as input a shot map, an initial orientation of a center of the shot map relative to a center of a wafer resulting in a maximum number of printable die, a usable wafer diameter, a selected yield margin, and historical yield information for each die location in the shot map; generating a plot of an estimated yield for each die location in the wafer from the historical yield information; plotting an estimated wafer yield within an area of the wafer as a function of a radius; and selecting a sweet spot radius corresponding to an area of the wafer having a wafer yield that is substantially equal to the selected yield margin for finding an offset from the initial orientation of the center of the shot map that results in a maximum wafer yield.

13 Claims, 6 Drawing Sheets

EXAMPLE OUTPUT

| | AT MAXIMUM YIELD WAFER AREA | | | Diameter of Maximum Yield Area | Die in Usable Area | Orientation: Number of Die in Max. Area |
|---|---|---|---|---|---|---|
| Y Offset | X Offset | Number of Die | | | | |
| 0 | 2 | 524 | | 168.6 | 836 | 624 |
| 0 | 3.7 | 524 | | 168.6 | 836 | 624 |
| 0 | 2 | 528 | | 169 | 836 | 628 |
| 0 | 3.7 | 528 | | 169 | 836 | 628 |
| 1.9 | 2.6 | 524 | | 168.6 | 835 | 624 |
| 1.9 | 2.7 | 524 | | 168.6 | 835 | 624 |
| 1.9 | 3 | 524 | | 168.6 | 835 | 624 |
| 1.9 | 3.1 | 524 | | 168.6 | 835 | 624 |
| 1 | 2.7 | 524 | | 168.6 | 835 | 624 |
| 1 | 3 | 524 | | 168.6 | 835 | 624 |
| 5.7 | 2 | 524 | | 168.6 | 834 | 624 |
| 1 | 2.8 | 631 | | 169.4 | 834 | 630 |
| 1 | 2.9 | 631 | | 169.4 | 834 | 630 |
| 1 | 3.1 | 631 | | 169.4 | 834 | 630 |
| 0 | 2.1 | 640 | | 170.6 | 834 | 638 |
| 0 | 2.2 | 640 | | 170.6 | 834 | 638 |
| 0 | 3.5 | 640 | | 170.6 | 834 | 638 |
| 0 | 3.6 | 640 | | 170.6 | 834 | 638 |
| 0.1 | 2.1 | 640 | | 170.6 | 834 | 638 |
| 0.1 | 3.6 | 640 | | 170.6 | 834 | 638 |
| 5.7 | 2.1 | 642 | | 171 | 834 | 640 |
| 5.7 | 3.6 | 642 | | 171 | 834 | 640 |
| 0 | 2.2 | 648 | | 171.8 | 834 | 642 |
| 0 | 3.5 | 648 | | 171.8 | 834 | 642 |
| 1 | 2.6 | 615 | | 167.4 | 833 | 612 |
| 0.3 | 2.7 | 615 | | 167.4 | 833 | 612 |
| 0.3 | 3 | | | | | |

OPTIMIZATION OF DIE YIELD IN A SILICON WAFER "SWEET SPOT"

BACKGROUND OF THE INVENTION

1. Field of the Invention

The present invention is directed to methods of manufacturing integrated circuits. More specifically, but without limitation thereto, the present invention is directed to a method of optimizing die yield in a silicon wafer.

2. Description of the Prior Art

In the manufacture of integrated circuit devices, a silicon wafer is typically partitioned into die or dice each having an identical arrangement of semiconductor structures. The die are formed on the silicon wafer by a photolithography tool, called a stepper. The stepper prints the die in groups, called shots, on the surface of the silicon wafer. The wafer yield is the number of die formed on the silicon wafer that perform satisfactorily to the design specifications of the integrated circuit device.

SUMMARY OF THE INVENTION

In one aspect of the present invention, a method of increasing the wafer yield for an integrated circuit includes the steps of receiving as input a shot map, an initial orientation of a center of the shot map relative to a center of a wafer resulting in a maximum number of printable die, a usable wafer diameter, a selected yield margin, and historical yield information for each die location in the shot map; generating a plot of an estimated yield for each die location in the wafer from the historical yield information; plotting an estimated wafer yield within an area of the wafer as a function of a radius; and selecting a sweet spot radius corresponding to an area of the wafer having a wafer yield that is substantially equal to the selected yield margin for finding an offset from the initial orientation of the center of the shot map that results in a maximum wafer yield.

In another aspect of the present invention, a computer program product for increasing die yield for a wafer layout of an integrated circuit includes a medium for embodying a computer program for input to a computer and a computer program embodied in the medium for causing the computer to perform steps of: receiving as input a shot map, an initial orientation of a center of the shot map relative to a center of a wafer resulting in a maximum number of printable die, a usable wafer diameter, and historical yield information for each die location in the shot map; plotting wafer yield versus distance from an edge of the wafer and the historical yield information to generate a yield functions calculating an expected yield for a plurality of die locations for each of a plurality of x-offsets and y-offsets; and selecting the x-offset and y-offset for which the expected yield is a maximum.

DESCRIPTION OF THE DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

DESCRIPTION OF THE ILLUSTRATED EMBODIMENTS

Wafer layout software is typically used to control a photolithography tool, or stepper, to partition a silicon wafer into die. In previous methods used by wafer layout software, the maximum number of die and the corresponding die map is calculated based on the performance parameters of the stepper. The stepper performance parameters include the number of die contained in each photo shot. The photo shot, more commonly referred to simply as a shot, is the area of the wafer containing the number of die that the stepper can print in a single exposure. The stepper prints a series of shots in rows and columns to cover the wafer area. The stepper performance parameters also include the shot size, the number of row shots required to cover the wafer area, and the number of column shots required to cover the wafer area.

In one aspect of the present invention, a method of increasing the wafer yield for an integrated circuit includes the steps of receiving as input a shot map, an initial orientation of a center of the shot map relative to a center of a wafer resulting in a maximum number of printable die, a usable wafer diameter, a selected yield margin, and historical yield information for each die location in the shot map; generating a plot of an estimated yield for each die location in the wafer from the historical yield information; plotting an estimated wafer yield within an area of the wafer as a function of a radius; and selecting a sweet spot radius corresponding to an area of the wafer having a wafer yield that is substantially equal to the selected yield margin for finding an offset from the initial orientation of the center of the shot map that results in a maximum wafer yield.

Figure 1:
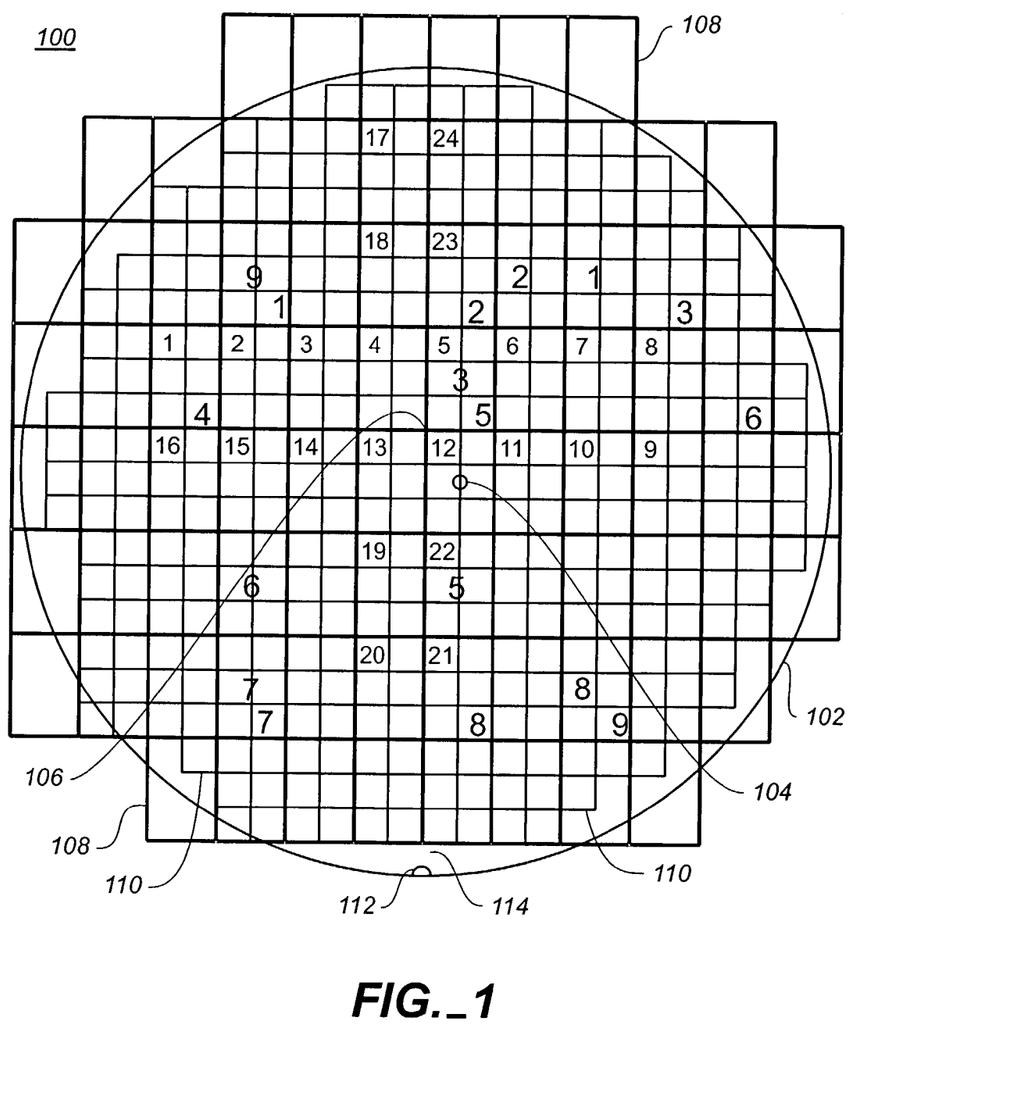
FIG. 1 illustrates an example of a shot map oriented on a silicon wafer according to a method of the prior art.

FIG. 1 illustrates an example of a shot map oriented on a silicon wafer according to a method of the prior art. Shown in FIG. 1 are a shot map 100, a silicon wafer 102, a wafer center 104, a shot map center 106, shots 108, die 110, a wafer notch 112, and a scribe title height 114.

The wafer layout software generates the shot map 100 of the die locations on the wafer according to well known techniques. The shot map 100 is then overlaid on the silicon wafer so that the center of the shot map coincides with the center of the silicon wafer 102. In this example, each shot 108 contains six die 110 arranged in a 2×3 rectangle. Because the shot map center 106 may not line up with the wafer center 104 to print the maximum number of die 110 within the area available on the silicon wafer 102, an offset of the shot map center 106 from the wafer center 104 may be calculated as follows.

Beginning with zero offset in the x and y directions, the wafer layout software calculates the number of printable die from the shot map 100. The center of the shot map 100 is then offset by small increments, typically limited by the resolution of the stepper to a fraction of a shot width. The offsets are made in each of the positive x direction, the negative x direction, the positive y direction, and the negative y direction on the silicon wafer 102 to generate a table of the number of printable die on the shot map 100 for each x-offset and y-offset. The x-offset and y-offset resulting in the orientation of the shot map 100 relative to the silicon wafer 102 that provides the maximum number of printable die is selected from the table of the number of printable die and is generated as the x-offset and y-offset for the orientation of the shot map 100. The wafer layout software also places the bottom row of shots sufficiently above the scribe title height 114 so that identifying indicia may be clearly inscribed on the silicon wafer 102 over the wafer notch 112 without interfering with the shots 108 in the bottom row. The resulting shot map 100 includes the x-offset and y-offset for the maximum number of printable die 110 on the silicon wafer 102.

Figure 2:
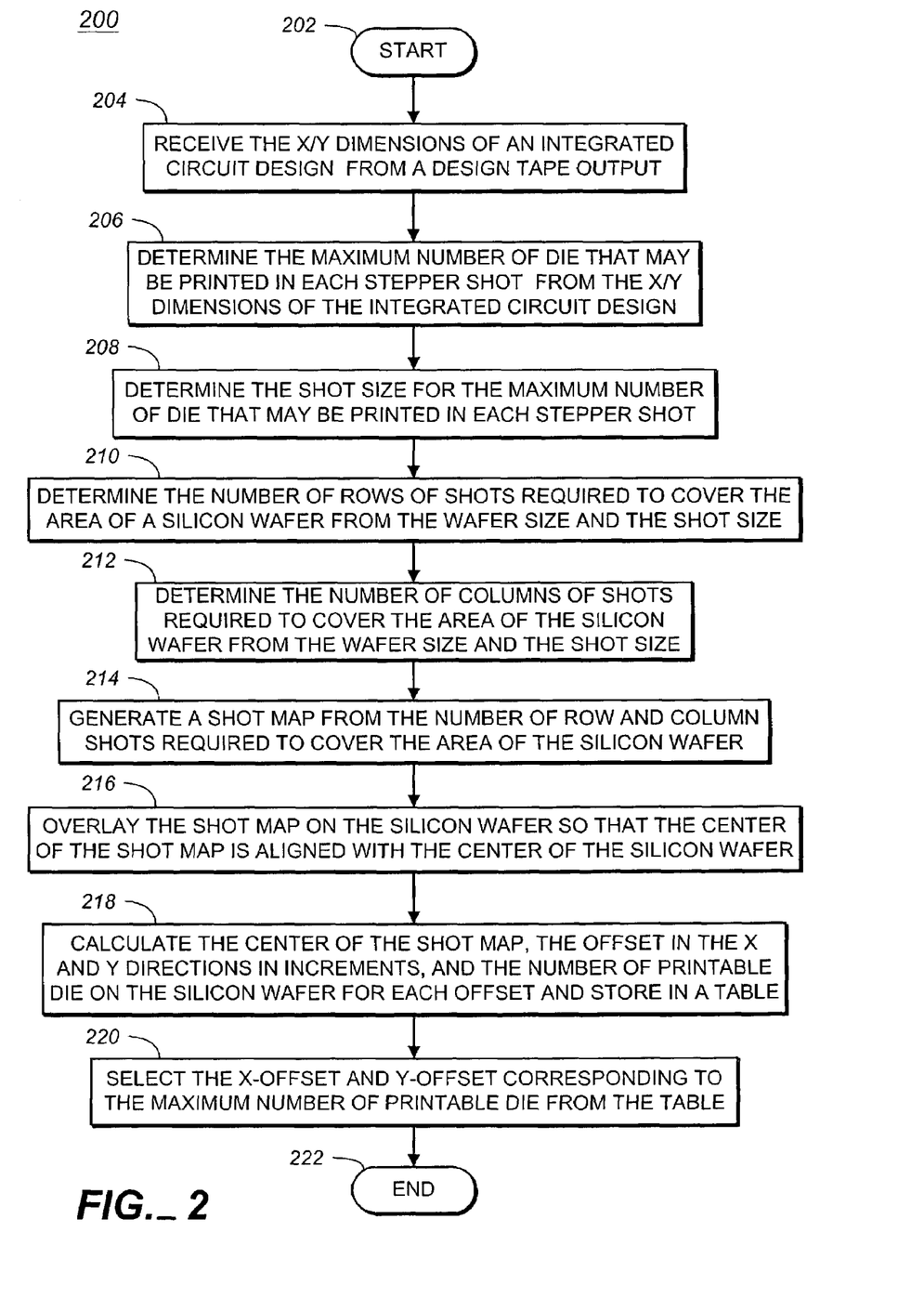
FIG. 2 illustrates a flow chart of a method of finding the x-off set and y-offset for the shot map in FIG. 1.

FIG. 2 illustrates a flow chart 200 of a method of finding the x-offset and y-offset for the shot map 100 in FIG. 1.

Step 202 is the entry point of the flow chart 200.

In step 204, the x/y dimensions of an integrated circuit design are received, for example, from a design tape output.

In step 206, the maximum number of die that may be printed in each stepper shot is determined from the x/y dimensions.

In step 208, the shot size is determined for the maximum number of die that may be printed in each stepper shot.

In step 210, the number of rows of shots required to cover the area of a silicon wafer is determined from the wafer size and the shot size.

In step 212, the number of columns of shots required to cover the area of the silicon wafer is determined from the wafer size and the shot size.

In step 214, a shot map is generated from the number of row and column shots required to cover the available area of the silicon wafer.

In step 216, the shot map is overlaid on the silicon wafer so that the center of the shot map is aligned with the center of the silicon wafer.

In step 218, the center of the shot map is offset in the x and y directions in increments and the number of printable die on the silicon wafer is calculated for each x-offset and y-offset and stored in a table.

In step 220, the x-offset and y-offset corresponding to the maximum number of printable die is selected from the table and generated as output.

Step 222 is the exit point of the flow chart 200.

A disadvantage of the method of the prior art described above for finding the x-offset and y-offset for the shot map 100 is that while the orientation provided by the x-offset and y-offset results in the maximum number of printable die on the silicon wafer 102, the maximum number of printable die does not generally provide the highest wafer yield.

Figure 3:
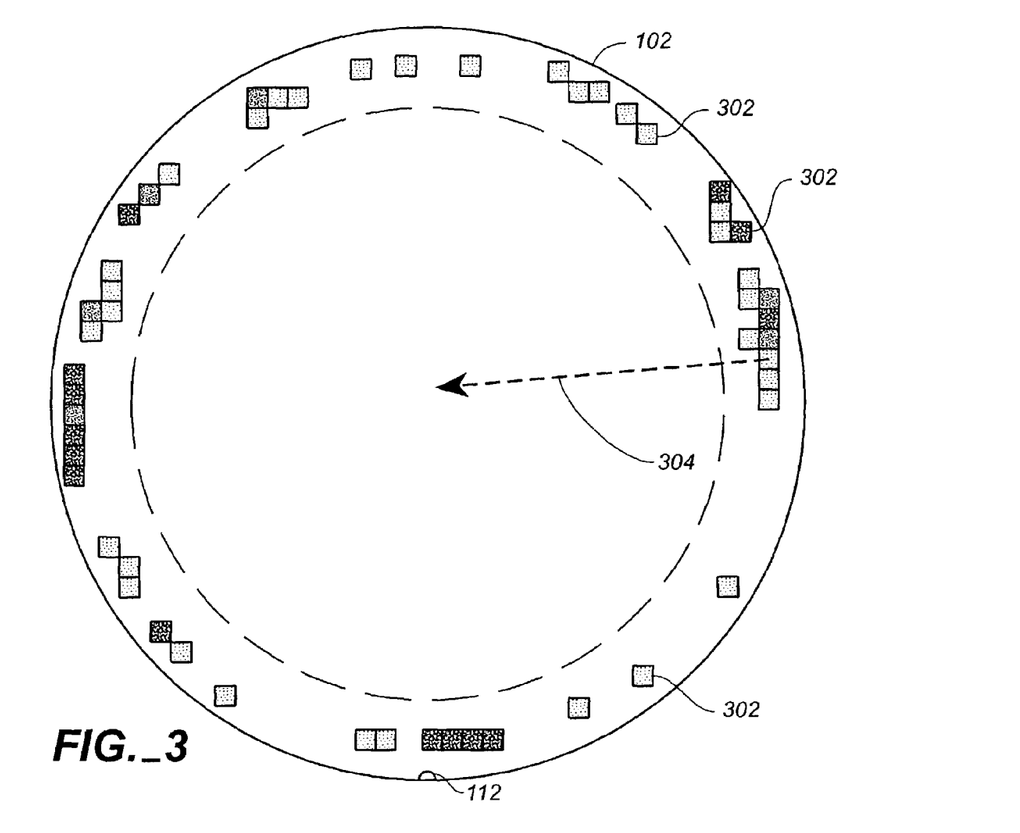
FIG. 3 illustrates a plot of the wafer yield as a percentage of total samples for each location of a wafer from historical data of an integrated circuit design according to an embodiment of the present invention.

FIG. 3 illustrates a plot of the wafer yield as a percentage of total samples for each location of a wafer from historical data of an integrated circuit design according to an embodiment of the present invention. Shown in FIG. 3 are a silicon wafer 102, a wafer notch 112, die locations 302, and a sweet spot radius 304.

The die locations 302 near the edge of the silicon wafer 102 generally have the lowest yield, while the die locations 302 closer to the center of the silicon wafer 102 generally have the highest yield. The estimated yield for each die location 302 may be plotted from the historical sample data for a specific integrated circuit design as shown in FIG. 4.

Figure 4:
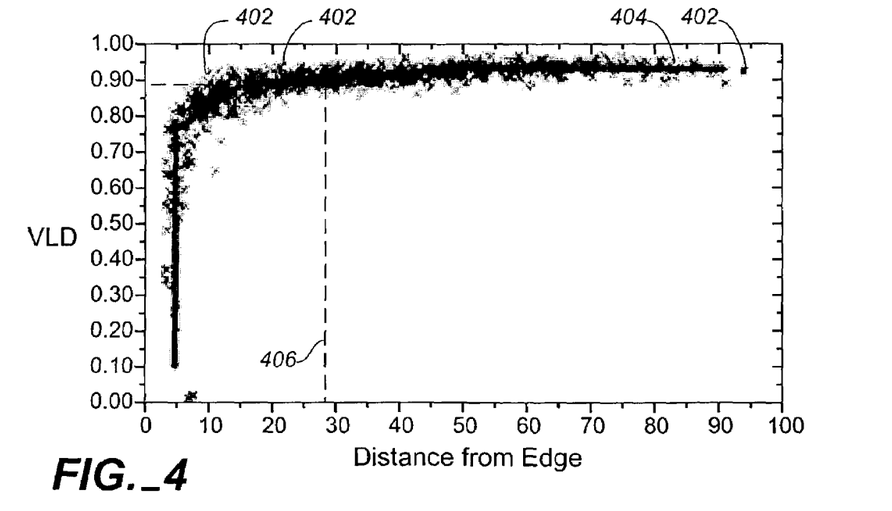
FIG. 4 illustrates a plot of the historical sample data in FIG. 3 for the estimated yield for each die location as a function of the distance from the edge of a 200 mm wafer.

FIG. 4 illustrates a plot of the historical sample data in FIG. 3 for the estimated yield for each die location 302 as a function of the distance from the edge of a 200 mm wafer. Shown in FIG. 4 are historical data points 402, an estimated yield curve 404, and a yield margin 406.

The yield margin 406 is a selected point on the estimated yield curve 404, typically at the distance from the edge of the silicon wafer 102 where the estimated yield for each die location 302 is between about 85 and 90 percent, which means that an estimated 85 to 90 percent of the wafer die at the corresponding distance from the center of the wafer will function within the specifications for the integrated circuit design based on the historical wafer data. The distance from the center of the wafer corresponding to the yield margin 406 is defined herein as the sweet spot radius 304 in FIG. 3. The sweet spot radius 304 may be used to find an x-offset and a y-offset from the initial orientation of the shot map that results in the maximum wafer yield as follows.

The shot map 100 in FIG. 1 including the initial offset resulting in the maximum number of printable die on the wafer is generated according to well-known techniques as described above with respect to FIG. 2. The shot map 100 is then overlaid on the plot of the wafer yield in FIG. 3. The overlay may be performed, for example, by comparing the coordinates of each offset die location 302 of the shot map 100 with the corresponding die location on the plot of the wafer yield in FIG. 3. The number of usable die within the area of the silicon wafer 102 defined by the sweet spot radius 304, that is, the sweet spot area, is calculated for the initial orientation of the shot map 100 by summing the estimated yield from each corresponding die location 302 in the shot map 100. The total number of usable die is then stored in a table of the number of usable die for the initial orientation of the shot map 100. The initial orientation of the shot map 100 is then offset by small increments, typically limited by the resolution of the stepper to a fraction of a shot width, for example, 80 microns. The offsets are made in each of the positive x-direction, the negative x-direction, the positive y-direction, and the negative y-direction on the silicon wafer 102 to generate a table of the number of usable die within the sweet spot area for each x-offset and y-offset.

Figure 5:
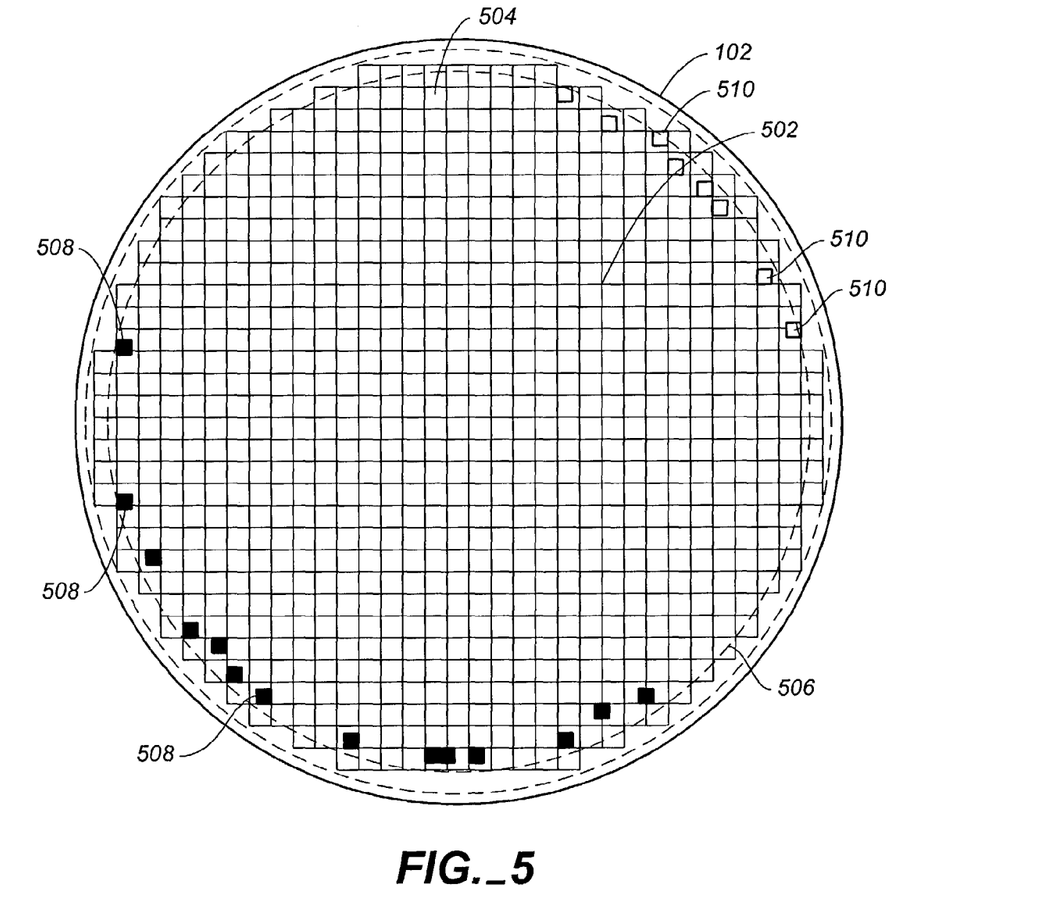
FIG. 5 illustrates a calculation of the number of usable die for an offset shot map in the negative x-direction and the negative y-direction according to an embodiment of the present invention.

FIG. 5 illustrates a calculation of the number of usable die for an offset shot map in the negative x-direction and the negative y-direction according to an embodiment of the present invention. Shown in FIG. 5 are a silicon wafer 102, an offset shot map 502, offset die locations 504, a sweet spot area 506, included die 508, and excluded die 510.

As a result of the offset in the negative x-direction and the negative y-direction, 14 included die 508 enter the sweet spot area and eight excluded die 510 leave the sweet spot area on the shot map 502. The total number of usable die in the sweet spot area 506 is changed accordingly, and there may also be radial and zonal pattern variations in the estimated yield from the historical data of the corresponding die locations 504 on the offset shot map 502 that are accounted for in the summation of the estimated yield for each of the offset die locations 504. The estimated yield for each of the offset die locations 504 is summed to calculate a total number of usable die in the sweet spot area 506 for each x-offset and y-offset.

The radius of the sweet spot area 506 is then incremented or decremented, for example, by an amount similar to the increment used for incrementing the x-offset and y-offset. Although the sweet spot area 506 in the example shown has a circular shape, any other shape may be used in various embodiments to practice the invention within the scope of the appended claims. In general, the sweet spot radius is a distance from a geometric center of the sweet spot area 506 at which the area of a circle having a radius equal to the distance is equal to the sweet spot area 506. The flexible shape of sweet spot area 506 facilitates applications to any given location or zone on the wafer where die yield may be improved through X/Y die placement offsets. A new table of usable die locations is then calculated as described above for the new sweet spot area 506 for each x-offset and y-offset. A similar table is generated for each new sweet spot area 506 by decrementing the sweet spot radius to a selected minimum, for example, 90 percent of the original sweet spot radius, and by incrementing the sweet spot radius to a selected a maximum, for example, 110 percent of the original sweet spot radius.

The maximum number of usable die is found in each of the tables of the number of usable die and is output as a trial x-offset and y-offset for the corresponding sweet spot radius. Each of the trial x-offsets and y-offsets is then searched to find the maximum number of usable die. The trial x-offset and y-offset for which the number of usable die is the highest is then added to the initial offset and generated as a total offset that results in the maximum wafer yield.

Figure 6:
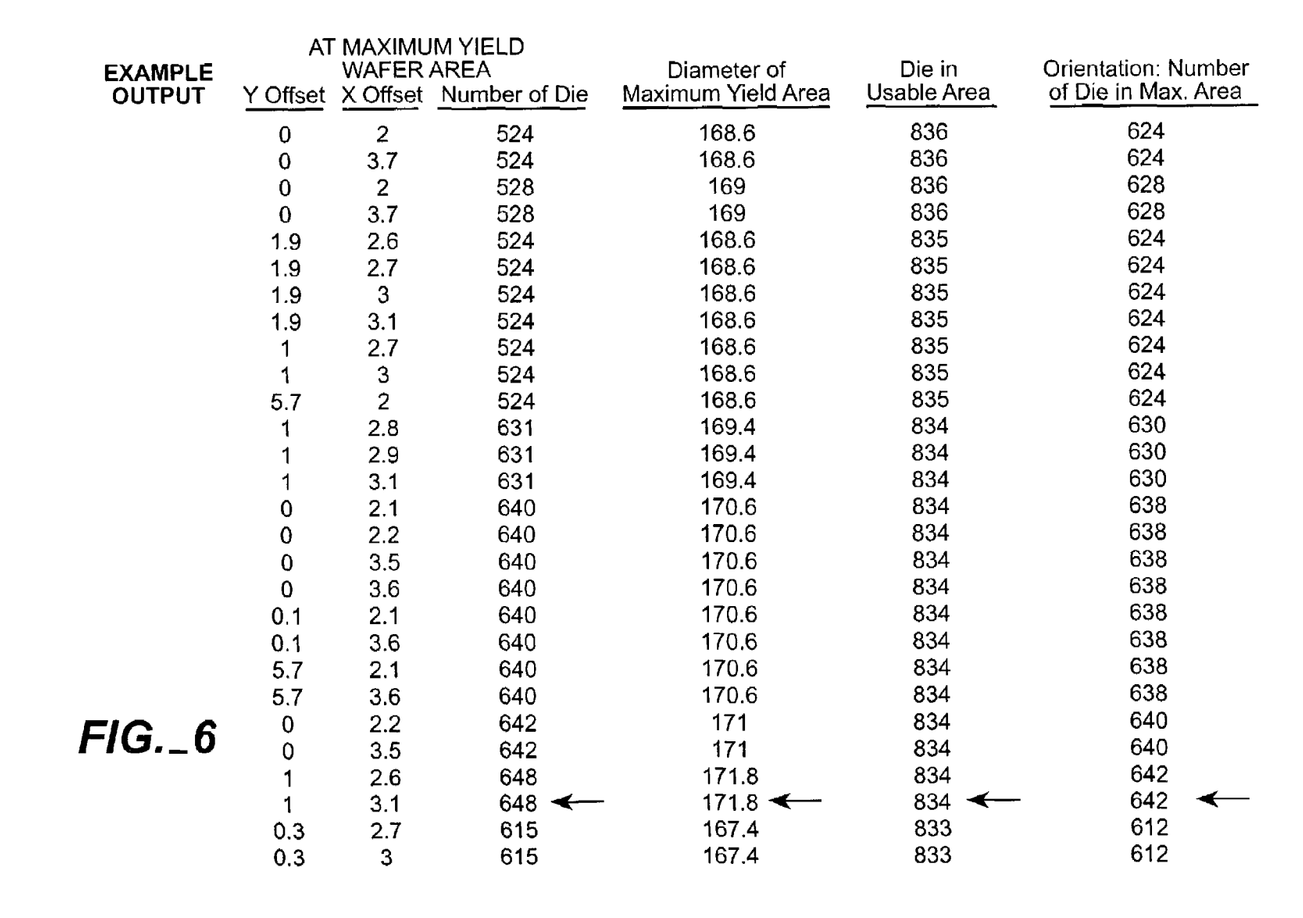
FIG. 6 illustrates a table of trial x-offsets and y-offsets versus number of usable die from the offset shot map of FIG. 5.

FIG. 6 illustrates a table of trial x-offsets and y-offsets versus number of usable die from the offset shot map of FIG. 5. At an x-offset of 3.1 mm and a y-offset of 1 mm within a sweet spot diameter of 171.8 mm, the number of usable die is 648. For the same area in the original orientation of the shot map 100, the number of usable die is 642. A net gain of six usable die from the same silicon wafer 102 is realized by adding the x-offset and y-offset calculated as shown in FIG. 5 to the original orientation of the shot map 100.

Figure 7:
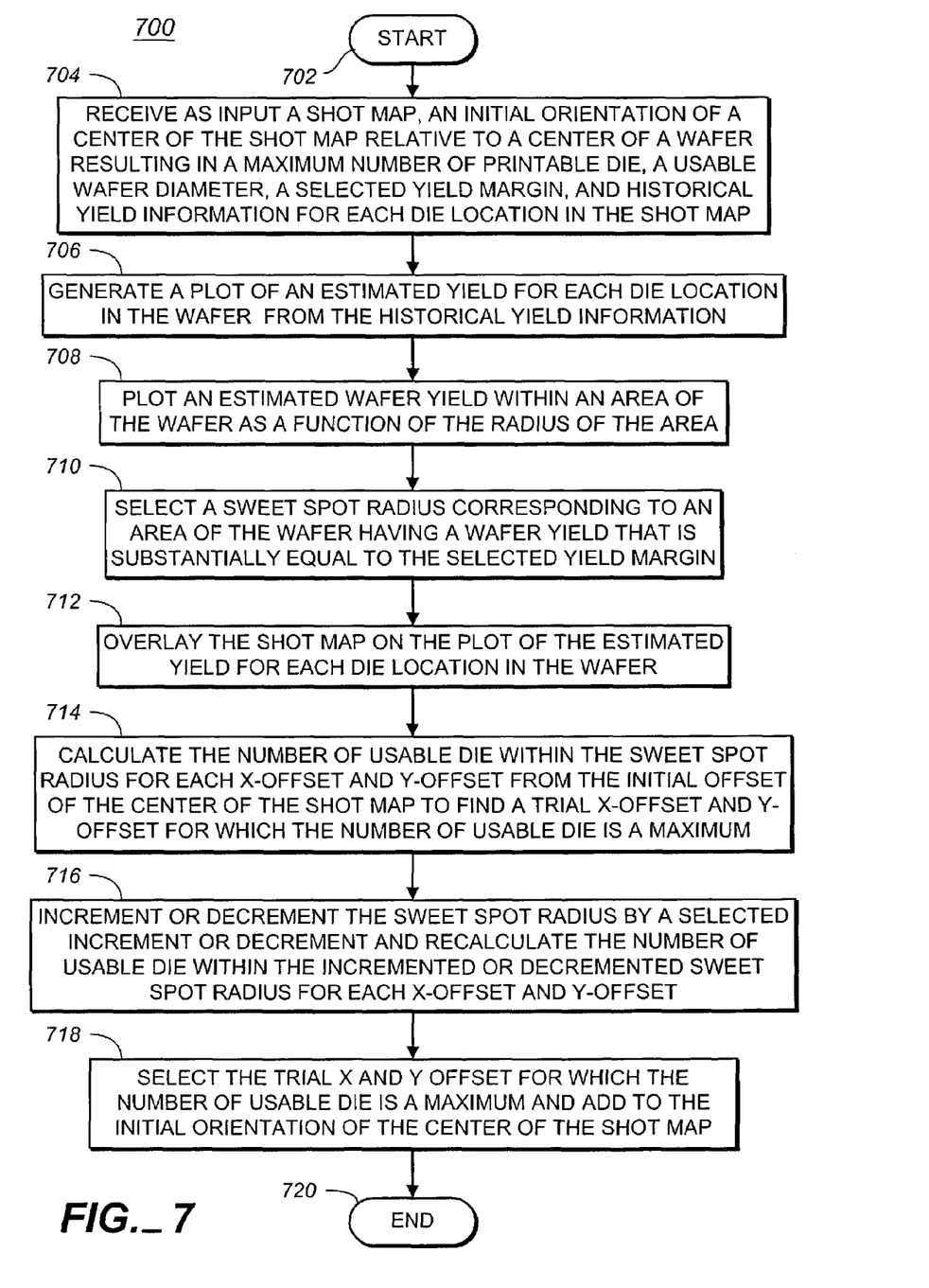
FIG. 7 illustrates a flow chart of a method of optimizing wafer yield according to an embodiment of the present invention.

FIG. 7 illustrates a flow chart of a method of optimizing wafer yield according to an embodiment of the present invention.

Step 702 is the entry point of the flow chart 700.

In step 704, a shot map, an initial orientation of a center of the shot map relative to a center of a wafer resulting in a maximum number of printable die, a usable wafer diameter, a selected yield margin, and historical yield information for each die location in the shot map are received as input.

In step 706, a plot of an estimated yield for each die location in the wafer is generated from the historical yield information.

In step 708, an estimated wafer yield within an area of the wafer is plotted as a function of the radius of the area.

In step 710, a sweet spot radius is selected corresponding to an area of the wafer having a wafer yield that is substantially equal to the selected yield margin. The sweet spot radius may be used to find an offset from the initial orientation of the center of the shot map that results in a maximum wafer yield as follows.

In step 712, the shot map is overlaid on the plot of the estimated yield for each die location in the wafer.

In step 714, the number of usable die within the sweet spot radius is calculated for each x-offset and y-offset from the initial offset of the center of the shot map to find a trial x-offset and y-offset for which the number of usable die is a maximum.

In step 716, the sweet spot radius is incremented or decremented by a selected increment or decrement and the number of usable die within the incremented or decremented sweet spot radius is recalculated for each x-offset and y-offset.

In step 718, the trial x and y offset for which the number of usable die is a maximum is selected and added to the initial orientation of the center of the shot map for obtaining the highest wafer yield.

Step 720 is the exit point of the flow chart 700.

The method of optimizing wafer yield illustrated by the flow chart 700 may be embodied in a computer program product and implemented by instructions for a computer according to well known programming techniques.

In another aspect of the present invention, a computer program product for optimizing wafer yield for an integrated circuit includes a medium for embodying a computer program for input to a computer and a computer program embodied in the medium for causing the computer to perform steps of: receiving as input a shot maps an initial orientation of a center of the shot map relative to a center of a wafer resulting in a maximum number of printable die, a usable wafer diameter, and historical yield information for each die location in the shot map; plotting wafer yield versus distance from an edge of the wafer and the historical yield information to generate a yield function; calculating an expected yield for a plurality of die locations for each of a plurality of x-offsets and y-offsets; and selecting the x-offset and y-offset for which the expected yield is a maximum.

In various embodiments of the present invention, the following functions may also be included: overlaying the shot map on the plot of the estimated yield for each die location in the wafer; calculating a number of usable die within the sweet spot radius for each of a plurality of x-offsets and y-offsets from the initial orientation of the center of the shot map to find a trial x-offset and y-offset for which the number of usable die is a maximum; incrementing or decrementing the sweet spot radius by a selected increment or decrement before calculating the number of usable die within the sweet spot radius; selecting the trial x-offset and y-offset for which the number of usable die is a maximum and generating as output the selected trial x-offset and y-offset plus the initial orientation of the center of the shot map for obtaining the highest wafer yield.

Although the method of the present invention is illustrated with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A method of increasing the wafer yield for an integrated circuit comprising steps of:

receiving as input a shot map, an initial orientation of a center of the shot map relative to a center of a wafer resulting in a maximum number of printable die, a usable wafer diameter, a selected yield margin, and historical yield information for each die location in the shot map;

plotting a yield function versus distance from an edge of the wafer and the historical yield information to generate a yield plot;

selecting a sweet spot area corresponding to an area of the wafer having a yield that is substantially equal to the selected yield margin;

calculating an expected yield of the sweet spot area for a plurality of X/Y offsets; and selecting the X/Y offset for which the expected yield is a maximum.

2. The method of claim 1 further comprising a step of overlaying the shot map on the yield plot for each die location in the wafer.

3. The method of claim 2 further comprising a step of calculating a number of usable die within the sweet spot radius for each of a plurality of x-offsets and y-offsets from the initial offset of the center of the shot map to find a trial x-offset and y-offset for which the number of usable die is a maximum.

4. The method of claim 3 further comprising a step of incrementing or decrementing the sweet spot radius by a selected increment or decrement before calculating the number of usable die within the sweet spot radius.

5. The method of claim 4 further comprising steps of selecting the trial x-offset and y-offset for which the number of usable die is a maximum and generating as output the selected trial x-offset and y-offset plus the initial orientation for obtaining the highest wafer yield.

6. The method of claim 1 wherein the selected yield margin is from about 85 percent to about 90 percent of the maximum number of printable die on the wafer.

7. A computer program product for increasing die yield for a wafer layout of an integrated circuit comprising:

a medium for embodying a computer program for input to a computer; and a computer program embodied in the medium for causing the computer to perform steps of:

receiving as input a shot map, an initial orientation of a center of the shot map relative to a center of a wafer resulting in a maximum number of printable die, a usable wafer diameter, a selected yield margin, and historical yield information for each die location in the shot map;

plotting a yield function versus distance from an edge of the wafer and the historical yield information to generate a yield plot;

selecting a sweet spot area corresponding to an area of the wafer having a yield that is substantially equal to the selected yield margin;

calculating an expected yield of the sweet spot area for a plurality of X/Y offsets; and selecting the X/Y offset for which the expected yield is a maximum.

8. The computer program product of claim 7 further comprising a step of overlaying the shot map on the yield plot for each die location in the wafer.

9. The computer program product of claim 8 further comprising a step of calculating a number of usable die within the sweet spot radius for each of a plurality of x-offsets and y-offsets from the initial offset of the center of the shot map to find a trial x-offset and y-offset for which the number of usable die is a maximum.

10. The computer program product of claim 9 further comprising a step of incrementing or decrementing the sweet spot radius by a selected increment or decrement before calculating the number of usable die within the sweet spot radius.

11. The computer program product of claim 10 further comprising steps of selecting the trial x and y offset for which the number of usable die is a maximum and generating as output the selected trial x-offset and y-offset plus the initial orientation of the center of the shot map for obtaining the highest wafer yield.

12. The computer program product of claim 7 wherein the selected yield margin is from about 85 percent to about 90 percent of the maximum number of printable die on the wafer.

13. A computer program product for increasing die yield for a wafer layout of an integrated circuit comprising:

a medium for embodying a computer program for input to a computer; and a computer program embodied in the medium for causing the computer to perform steps of;

receiving as input a shot map, an initial orientation of a center of the shot map relative to a center of a wafer resulting in a maximum number of printable die, a usable wafer diameter, and historical yield information for each die location in the shot map;

plotting wafer yield versus distance from an edge of the wafer and the historical yield information to generate a yield function;

calculating an expected yield for a plurality of die locations for each of a plurality of x-offsets and y-offsets;

and selecting the x-offset and y-offset for which the expected yield is a maximum.

* * * * *